United States Patent
Qiu

(10) Patent No.: US 8,748,060 B2
(45) Date of Patent: Jun. 10, 2014

(54) FLUORINATED COATING AND PHOTOTOOLS MADE THEREWITH

(75) Inventor: Zai-Ming Qiu, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 132 days.

(21) Appl. No.: 13/389,043

(22) PCT Filed: Sep. 14, 2010

(86) PCT No.: PCT/US2010/048757
§ 371 (c)(1),
(2), (4) Date: Feb. 6, 2012

(87) PCT Pub. No.: WO2011/034847
PCT Pub. Date: Mar. 24, 2011

(65) Prior Publication Data
US 2012/0164565 A1    Jun. 28, 2012

Related U.S. Application Data

(60) Provisional application No. 61/243,043, filed on Sep. 16, 2009.

(51) Int. Cl.
| | | |
|---|---|---|
| G03F 1/00 | (2012.01) |
| G03F 7/11 | (2006.01) |
| C08G 65/00 | (2006.01) |
| C08G 65/336 | (2006.01) |
| C09D 133/16 | (2006.01) |
| C07F 7/10 | (2006.01) |
| C07F 7/08 | (2006.01) |
| C08F 220/24 | (2006.01) |
| C08F 30/08 | (2006.01) |

(52) U.S. Cl.
USPC ............... 430/5; 430/18; 430/14; 430/273.1; 430/536; 522/103; 549/215

(58) Field of Classification Search
CPC ........................................................ G03F 1/48
See application file for complete search history.

(56) References Cited

U.S. PATENT DOCUMENTS

| | | |
|---|---|---|
| 3,131,161 A | 4/1964 | Nitzsche |
| 3,250,808 A | 5/1966 | Moore, Jr. |
| 3,753,755 A | 8/1973 | Olson |
| 3,875,045 A | 4/1975 | Bergrahm |
| 4,000,115 A | 12/1976 | Jacobs |
| 4,025,348 A | 5/1977 | Tsukada |
| 4,025,407 A | 5/1977 | Chang |
| 4,049,861 A | 9/1977 | Nozari |
| 4,058,401 A | 11/1977 | Crivello |
| 4,069,055 A | 1/1978 | Crivello |
| 4,094,911 A | 6/1978 | Mitsch |
| 4,100,134 A | 7/1978 | Robins |
| 4,101,513 A | 7/1978 | Fox |
| 4,130,690 A | 12/1978 | Lien |
| 4,156,035 A | 5/1979 | Tsao |
| 4,156,046 A | 5/1979 | Lien |
| 4,161,478 A | 7/1979 | Crivello |
| 4,267,302 A | 5/1981 | Ohmori |
| 4,279,717 A | 7/1981 | Eckberg |
| 4,293,606 A | 10/1981 | Zollinger |
| 4,333,998 A | 6/1982 | Leszyk |
| 4,337,107 A | 6/1982 | Eshleman |
| 4,348,462 A | 9/1982 | Chung |
| 4,353,980 A | 10/1982 | Helling |
| 4,399,192 A | 8/1983 | Russell |
| 4,426,431 A | 1/1984 | Harasta |
| 4,504,401 A | 3/1985 | Matsuo |
| 4,508,916 A | 4/1985 | Newell |
| 4,623,676 A | 11/1986 | Kistner |
| 4,647,413 A | 3/1987 | Savu |
| 4,818,801 A | 4/1989 | Rice |
| 4,830,910 A | 5/1989 | Larson |
| 4,959,426 A | 9/1990 | Re |
| 5,021,501 A | 6/1991 | Ohmori |
| 5,073,404 A | 12/1991 | Huang |
| 5,242,972 A * | 9/1993 | Negishi et al. ................ 524/545 |
| 5,274,159 A | 12/1993 | Pellerite |
| 5,340,898 A | 8/1994 | Cavezzan |
| 5,514,728 A | 5/1996 | Lamanna |
| 5,554,664 A | 9/1996 | Lamanna |
| 5,576,095 A | 11/1996 | Ueda |

(Continued)

FOREIGN PATENT DOCUMENTS

| | | |
|---|---|---|
| DE | 10004132 | 8/2001 |
| EP | 212319 | 3/1987 |

(Continued)

OTHER PUBLICATIONS

Lewis, Richard J, Sr. "oligomer" from Hawley's Condensed Chemical Dictionary, Fifteenth Edition, Wiley-Interscience, Joh Wiley & Sons, Inc., Hoboken, NJ 2007, p. 925.*

English translation of DE 10004132 generated from the EPO website on Sep. 16, 2013, 9 pages including description and claims.*

Bongiovanni, "Use of Fluorinated Compounds in Cationic UV-curing," Photochemistry and UV Curing: New Trends, 2006, pp. 279-292.

Bongiovanni, "Fluorinated Additives in Cationic Photopolymerization," RadTech Europe, [online], [retrieved from the internet on Oct. 6, 2011], website no longer available, www.radtech-europe.com/filescontent/september%202004%20papers/bongiovannipaperseptember2004.pdf, pp. 7.

(Continued)

Primary Examiner — Cynthia Hamilton
(74) Attorney, Agent, or Firm — Robert W. Sprague

(57) ABSTRACT

A coating including an oligomer is disclosed, the oligomer being the reaction product of an epoxy silane, a multifunctional (meth)acrylate; and a polymerizable fluorochemical. The polymerizable fluorochemical can be fluorinated (meth)acrylate or a polymerizable fluorinated urethane. Phototools having a layer of the coating on a substrate can be made. A method of making a printed assembly such as a printed circuit board is also disclosed.

22 Claims, No Drawings

(56) References Cited

U.S. PATENT DOCUMENTS

| | | | |
|---|---|---|---|
| 5,723,860 | A | 3/1998 | Hamada |
| 5,980,992 | A | 11/1999 | Kistner |
| 6,187,834 | B1 | 2/2001 | Thayer |
| 6,190,743 | B1 | 2/2001 | Wang |
| 6,204,350 | B1 | 3/2001 | Liu |
| 6,344,526 | B1 | 2/2002 | Noguchi |
| 6,361,870 | B1 | 3/2002 | Steffl |
| 6,448,346 | B1 | 9/2002 | Noguchi |
| 6,646,088 | B2 | 11/2003 | Fan |
| 6,678,495 | B1 | 1/2004 | Badesha |
| 6,753,380 | B2 | 6/2004 | Qiu |
| 6,767,946 | B2 | 7/2004 | Shimada |
| 6,803,109 | B2 | 10/2004 | Qiu |
| 6,811,931 | B1 | 11/2004 | Fujioka |
| 7,037,585 | B2 | 5/2006 | Treadway |
| 7,097,910 | B2 | 8/2006 | Moore |
| 7,166,329 | B2 | 1/2007 | Dams |
| 7,189,479 | B2 | 3/2007 | Lu |
| 7,335,786 | B1 | 2/2008 | Iyer |
| 7,495,118 | B2 | 2/2009 | Dams |
| 7,718,264 | B2 | 5/2010 | Klun |
| 7,728,098 | B2 | 6/2010 | Dams |
| 7,745,653 | B2 | 6/2010 | Iyer |
| 7,825,272 | B2 | 11/2010 | Iyer |
| 7,897,678 | B2 | 3/2011 | Qiu |
| 8,002,886 | B2 | 8/2011 | Clark |
| 8,015,970 | B2 | 9/2011 | Klun |
| 2003/0207963 | A1 | 11/2003 | Zang |
| 2004/0014718 | A1 | 1/2004 | Pai |
| 2004/0077775 | A1 | 4/2004 | Audenaert |
| 2004/0092675 | A1 | 5/2004 | Moore |
| 2004/0147188 | A1 | 7/2004 | Johnson |
| 2005/0037932 | A1 | 2/2005 | Liu |
| 2005/0042553 | A1 | 2/2005 | Lu |
| 2005/0054804 | A1 | 3/2005 | Dams |
| 2005/0121644 | A1 | 6/2005 | Dams |
| 2005/0164010 | A1 | 7/2005 | Trombetta |
| 2005/0196626 | A1 | 9/2005 | Knox |
| 2005/0196696 | A1 | 9/2005 | King |
| 2005/0233103 | A1 | 10/2005 | Enomoto |
| 2006/0147177 | A1 | 7/2006 | Jing |
| 2006/0148350 | A1 | 7/2006 | Chang |
| 2006/0153993 | A1 | 7/2006 | Schmidt |
| 2006/0154091 | A1 | 7/2006 | Schmidt |
| 2006/0165919 | A1 | 7/2006 | Suzuki |
| 2006/0216524 | A1 | 9/2006 | Klun |
| 2006/0228560 | A1 | 10/2006 | Stewart |
| 2007/0014927 | A1 | 1/2007 | Buckanin |
| 2007/0128557 | A1 | 6/2007 | Lu |
| 2007/0275171 | A1 | 11/2007 | Dang |
| 2007/0287093 | A1 | 12/2007 | Jing |
| 2008/0041272 | A1 | 2/2008 | Tomasino |
| 2008/0075947 | A1 | 3/2008 | Padiyath |
| 2008/0124555 | A1 | 5/2008 | Klun |
| 2009/0025608 | A1 | 1/2009 | Qiu |
| 2009/0025727 | A1 | 1/2009 | Klun |
| 2009/0148711 | A1 | 6/2009 | LeBlanc |
| 2010/0092686 | A1 | 4/2010 | Laryea |
| 2010/0160595 | A1 | 6/2010 | Klun |
| 2011/0008733 | A1 | 1/2011 | Qiu |
| 2011/0020657 | A1 | 1/2011 | Chang |
| 2011/0027702 | A1 | 2/2011 | Qiu |
| 2011/0065045 | A1 | 3/2011 | Qiu |
| 2012/0171433 | A1* | 7/2012 | Qiu ........................... 428/195.1 |

FOREIGN PATENT DOCUMENTS

| | | |
|---|---|---|
| EP | 271872 | 6/1988 |
| EP | 572179 | 12/1993 |
| EP | 1083205 | 3/2001 |
| EP | 1225187 | 7/2002 |
| EP | 1225188 | 7/2002 |
| EP | 1411073 | 4/2004 |
| FR | 2886309 | 12/2006 |
| JP | 2232251 | 9/1990 |
| JP | 10176139 | 6/1998 |
| JP | 2004250517 | 9/2004 |
| JP | 2005046767 | 2/2005 |
| JP | 2006169328 | 6/2006 |
| KR | 10-2006-0080182 | 7/2006 |
| WO | WO 03/055954 | 7/2003 |
| WO | WO 03/072625 | 9/2003 |
| WO | WO 2004/024790 | 3/2004 |
| WO | WO 2004/056495 | 7/2004 |
| WO | WO 2005/014742 | 2/2005 |
| WO | WO 2005/023822 | 3/2005 |
| WO | WO 2006/030721 | 3/2006 |
| WO | WO 2006/074033 | 7/2006 |
| WO | WO 2008/131715 | 11/2008 |
| WO | WO 2009/035874 | 3/2009 |
| WO | WO 2009/069974 | 6/2009 |
| WO | WO 2009/083564 | 7/2009 |
| WO | WO 2009/086515 | 7/2009 |
| WO | WO 2009/114572 | 9/2009 |
| WO | WO 2009/114580 | 9/2009 |
| WO | WO 2011/011167 | 1/2011 |
| WO | WO 2011/034845 | 3/2011 |
| WO | WO 2011/034885 | 3/2011 |

OTHER PUBLICATIONS

Coggio, "New Durable, Soil Resistant Optical Film for Front Surface Protection of Flat-Panel Displays", Digest of Technical Papers, Society for Information Display International Symposium, 2005, vol. 36, pp. 175-177.

"Epoxide", source unknown, date unknown but believed to be prior to the date of the filing of the present application, 4 pages.

"Epoxy Resins", source unknown, date unknown but believed to be prior to the date of the filing of the present application, 4 pages.

"Mask Process", PKL, 1997, Choognam, Korea, [online], [retrieved from the internet on Feb. 25, 2008], URL <www.pkl.co.kr/english/product/product05.html>, 3 pages.

Physical Review E, Statistical Physics, Plasmas, Fluids, and Related Interdisciplinary Topics, Feb. 1999, Part A, Third Series, vol. 59, No. 2, 5 pages.

Sangermano, "Fluorinated Alcohols as Surface-Active Agents in Cationic Photopolymerization of Epoxy Monomers", Journal of Polymer Science: Part A: Polymer Chemistry, Feb. 2006, vol. 43, pp. 4144-4150.

Sangermano, "Fluorinated Hyperbranched Polymers as Additives in Cationic Photopolymerization", Macromolecular Materials and Engineering, 2004, vol. 289, No. 8, pp. 722-727.

Sangermano, "Synthesis and Cationic Photopolymerization of a New Fluorinated Oxetane Monomer", Polymer, 2004, vol. 45, No. 7, pp. 2133-2139.

Sangermano, "Synthesis and Cationic Photopolymerization of New Fluorinated Polyfunctional Propenyl Ether Oligomers", Journal of Polymer Science, Part A: Polymer Chemistry, 2006, vol. 44, pp. 6943-6951.

Yarbrough, "Contact Angle Analysis, Surface Dynamics, and Biofouling Characteristics of Cross-Linkable, Random Perfluoropolyether-Based Graft Terpolymers", Macromolecules, 2006, vol. 39, No. 7, pp. 2521-2528.

International Search Report for PCT/US2010/048757, mailed Dec. 23, 2010, 4 pages.

* cited by examiner

FLUORINATED COATING AND PHOTOTOOLS MADE THEREWITH

CROSS REFERENCE TO RELATED APPLICATIONS

This application is a national stage filing under 35 U.S.C. 371 of PCT/US2010/048757, filed Sep. 14, 2010, which claims priority to Provisional Application No. 61/243,043, filed Sep. 16, 2009.

FIELD

Fluorinated coatings, particularly fluorinated coatings made from polymerizable fluorochemicals, epoxy silanes, and (meth)acrylates, are disclosed. Phototools made with the coatings can be made and used to form printed assemblies such as printed circuit boards.

BACKGROUND

In the printed circuit industry, a mask bearing an image in the form of a circuit pattern is known as a phototool. A photosensitive material can be disposed between the phototool and a metal substrate, and radiation applied through the phototool to form the negative of the image in the form of hardened photosensitive material. The phototool is then separated from the hardened and unhardened photosensitive material, and any unhardened photosensitive material removed to leave the hardened negative image on the substrate. It is desirable for a phototool to be durable enough such that it can be used repeatedly with accurate reproduction of a circuit pattern.

SUMMARY

Disclosed herein is a coating comprising the reaction product of an oligomer, the oligomer comprising $M^F M^E M^A$ wherein $M^F$ comprises a polymerizable fluorochemical, $M^E$ comprises an epoxy silane, and $M^A$ comprises a multifunctional (meth)acrylate.

The polymerizable fluorochemical may comprise an epoxy group, a hydrolysable silane group, a (meth)acrylate group or a mixture thereof. For example, the polymerizable fluorochemical may comprise: a first polymerizable fluorochemical comprising a hydrolysable silane group, and a second polymerizable fluorochemical comprising a (meth)acrylate group. For another example, the polymerizable fluorochemical may comprise: a first polymerizable fluorochemical comprising an epoxy group and hydrolysable silane group, and a second polymerizable fluorochemical comprising a (meth)acrylate group. In some embodiments, the coating may further comprise a multifunctional epoxide and/or a curable silane.

Phototools comprising a layer of the coating on a substrate can be made. For example, the phototool may comprise a layer of the coating on an optically clear substrate that provides an image. Phototools having a circuit pattern as the image can be used in conjunction with radiation sensitive materials to make printed circuit boards.

An assembly comprising the phototool disclosed herein is also disclosed. The assembly may comprise: a phototool comprising a coating layer disposed on an optically clear substrate that provides an image, the coating layer comprising any of the coatings disclosed herein; a photoresist disposed on the coating layer; and a metal substrate disposed on the photoresist opposite the coating layer.

A method of making a printed assembly is also disclosed. The method may comprise: providing any of the assemblies disclosed herein, and exposing the photoresist layer to radiation through the phototool, thereby hardening the photoresist layer in selected areas to form a negative image of the image provided by the optically clear substrate. The phototool can then be separated from the hardened photoresist layer. The printed assembly may comprise a printed circuit board.

DETAILED DESCRIPTION

During manufacture of printed circuit assemblies, the surface of a phototool which bears the circuit pattern must be routinely and carefully inspected using a microscope to ensure that there are no scratches on the surface, for example, breaks in the fine lines in the circuit pattern. These inspections can take from 2 to 3 hours depending on the size and intricacy of the circuit pattern. Scratches and other abrasions can occur as the surface of the phototool is often wiped to remove dust, lint, etc. Also, the phototool is typically laminated onto copper sheeting, with photosensitive material in between, and small burrs or rough edges of the copper sheeting can cause scratches and other abrasions on the surface of the phototool.

Due to the fact that phototools are vulnerable to scratching and that abrasion is a serious problem during the normal use of a phototool, protective films and overcoats are often employed to protect the phototool. For example, polyester films coated with various kinds of pressure sensitive adhesives have been laminated to image-bearing surfaces to protect the image. Because of their thickness, however, laminating films can cause optical distortion and hence loss of resolution. Thinner protective coatings can be obtained by coating the surfaces of phototools with liquid compositions. After application, the thin liquid coating is hardened to yield the desired protective coat. Many protective overcoats have limited release properties, however, and can therefore stick to the surface of the photoresist, particularly when relatively sticky materials such as high viscosity solder mask inks are present. Although film with silicone layer applied by lamination on phototool can provide good release properties, it is soft and almost no resistant to scratch with limited protection in addition to thickness issue.

In view of the foregoing, there is a need for coating compositions or coatings that can be used to protect surfaces and objects from scratching and abrasion, and for phototool applications, it would be advantageous if coatings easily release from relatively sticky materials such as solder mask inks.

The coatings disclosed herein can provide abrasion resistance, hardness, clarity, low surface energy with low adhesion, release properties, anti-reflection, resistance to staining and soiling, and repellency to stains, soils, solvents, oil, and water. When coated on a substrate, the coating is relatively durable, more resistant to contamination and easier to clean than the bare substrate surface itself. Any substrate may be employed including hard substrates such as natural stone, man-made stone, ceramic, vinyl, wood, masonry, cork, glass, or the like. Polymeric substrates such as poly(ethylene terephthalate), polycarbonate and polymethylmethacryate may also be employed.

The coatings may be used for protecting phototools from scratching and abrasion. The coatings can have good release properties and not stick to photoresist surfaces even when sticky materials such as solder masks are present. Phototools with the coatings disclosed herein can be used repeatedly to make many contact prints, for example, the phototools can be used at least 5, 10 or 20 times.

The coatings can have low surface energy with receding water contact angles greater than about 70° (preferably, greater than about 80°; more preferably, greater than about 90°) and receding hexadecane contact angles greater than about 50° (preferably, greater than about 55°, more preferably, greater than about 60°). The coatings can have good release properties as evidenced by low peel force.

Generally, the coating comprises the reaction product of an oligomer comprising $M^F M^E M^A$, m wherein $M^F$ comprises a polymerizable fluorochemical, $M^E$ comprises an epoxy silane, and $M^A$ comprises a multifunctional (meth)acrylate. The coating may comprise the reaction product of an epoxy silane, a multifunctional (meth)acrylate and an oligomer comprising $M^{FMA} M^{EMA}$ wherein $M^{FMA}$ comprises a fluorinated (meth)acrylate, and $M^{EMA}$ comprises an epoxy(meth) acrylate. The coating may comprise the reaction product of an epoxy silane, a multifunctional (meth)acrylate and an oligomer comprising $M^{FMA} M^{SMA}$ wherein $M^{FMA}$ comprises a fluorinated (meth)acrylate, and $M^{SMA}$ comprises a silane (meth) acrylate. The coating may comprise the reaction product of an epoxy silane, a multifunctional (meth)acrylate oligomer comprising $M^{FMA} M^{EMA} M^{SMA}$ wherein $M^{FMA}$ comprises a fluorinated (meth)acrylate, $M^{EMA}$ comprises an epoxy(meth) acrylate and $M^{SMA}$ comprises a silane (meth)acrylate. The coating may comprise the reaction product of an epoxy silane, a multifunctional (meth)acrylate and polymerizable fluorinated urethane.

The epoxy silane is generally curable as described below, for example, using a photo-acid generator. The epoxy silane comprises at least one polymerizable epoxy group and at least one polymerizable silane group. Either one or both of these polymerizable groups may be terminal groups. The epoxy silane may be monomeric, oligomeric, or polymeric. The epoxy silane may be represented by the formula:

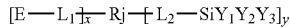

wherein: E is an organic group having at least one oxirane ring; $L_1$ and $L_2$ are independently divalent linking groups; Rj is multivalent monomeric, oligomeric, or polymeric residue; $Y_1$, $Y_2$ and $Y_3$ are independently alkyl groups, aryl groups or hydrolysable groups, wherein at least one of $Y_1$, $Y_2$ and $Y_3$ is a hydrolysable group; x is at least 1; and y is at least 1. E may comprise an organic group having a glycidoxy or epoxycyclohexyl group. Hydrolysable groups include alkoxy groups having $C_1$-$C_4$ alkyl groups. In general, for structural formulae appearing within this description, substitution of divalent linking groups is implied unless specifically excluded.

$L_1$ and $L_2$ may comprise independently non-hydrolysable linear or branched, cyclic or acyclic aliphatic, aromatic, or aliphatic and aromatic divalent hydrocarbon linking groups. The divalent linking groups may have less than 20 carbon atoms or less than 10 carbon atoms, for example, the divalent linking groups may comprise independently methylene, ethylene, isopropylene, butylene, decalene, phenylene, cyclohexylene, cyclopentylene, methylcyclohexylene, 2-ethylbutylene, vinyl or allene. $L_1$ and $L_2$ may comprise independently —$C_6H_4$—$CH_2CH_2$— or —$CH_2C(CH_3)_2CH_2$—. $L_1$ and $L_2$ may comprise independently an acyl group such as formyl, acetyl, and propionyl.

$L_1$ and $L_2$ may comprise independently one or more heteroatoms such as N, O, and S as long as the curability or performance of the coating is not affected detrimentally. Suitable divalent linking groups may comprise ether, ester, amide, $NO_2$, alkyloxy, thioether, sulfone, and halogen functionality.

$L_1$ and $L_2$ may comprise independently ethylene oxide functionality as represented by —$(CH_2CH_2O)_k Z$— wherein k is an integer of from 1 to 10 and Z is an alkylene group of less than 10 carbon atoms. $L_1$ and $L_2$ may comprise independently —$CH_2CH_2$—, —$CH_2CH_2OCH_2CH_2$—, —$(CH_2CH_2)_2 OCH_2CH_2$—, —$CH_2OCH_2CH_2$— or —$CH_2OCH_2CH_2CH_2$—.

Useful epoxy silanes may be represented by the formula:

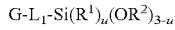

wherein: G is a glycidoxy or epoxycyclohexyl group; $L_1$ is a divalent linkage as described above; $R^1$ and $R^2$ are independently $C_1$-$C_4$ alkyl groups; and u is 0 or 1. Exemplary epoxy silanes include glycidoxymethyl trialkoxysilanes; glycidoxyethyl trialkoxysilanes; glycidoxypropyl trialkoxysilanes; glycidoxybutyl trialkoxysilanes; (3,4-epoxycyclohexyl)methyl trialkoxysilanes; (3,4-epoxycyclohexyl)ethyl trialkoxysilanes; (3,4-epoxycyclohexyl)propyl trialkoxysilanes; and (3,4-epoxycyclohexyl)butyl trialkoxysilanes. Particular epoxy silanes are described in International Application No. PCT/US2009/036733 to Qiu et al.

The epoxy silane may comprise:

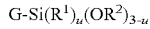

wherein G, $R^2$ and $R^3$ are described in the previous paragraph.

The epoxy silane may comprise:

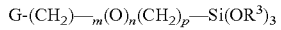

wherein: G is a glycidoxy or epoxycyclohexyl group; m is 1 to 6; n is 0 or 1; p is 1 to 6; $R^3$ is H or $C_1$-$C_{10}$ alkyl group.

Partially hydrolysed derivatives of any of the epoxy silanes disclosed herein may be useful; these partially hydrolysed derivatives comprise silanes in which alkoxy groups bonded to silicon are replaced by hydroxyl groups. Partially condensated derivatives of any of the epoxy silanes disclosed herein may be useful; these partially condensated derivatives comprise silanes in which alkoxy groups bonded to silicon are replaced by siloxy groups. For example, partially hydrolysed and partially condensated derivatives may comprise:

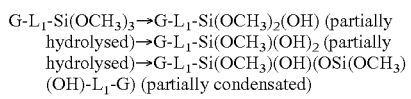

Partially hydrolysed and/or partially condensated derivatives may be used alone or in combination with each other, and/or with any of the epoxy silanes disclosed herein. Prepolymers are formed by the polymerization of groups other than the silanes as in U.S. Pat. No. 4,100,134 (Robins et al.) and U.S. Pat. No. 7,037,585 (Treadway).

The epoxy silane may be selected from the group consisting of: gamma-glycidoxypropyl trimethoxysilane and beta-(3,4-epoxycyclohexyl)ethyl trimethoxysilane.

The epoxy silane may be used in any amount desired depending on the desired properties of the coating. For example, the epoxy silane may comprise from about 50 to about 90 wt. % or from about 70 to about 90 wt. %, relative to the total weight of the coating. The epoxy silane may also comprise from about 70 to about 98 wt. %, or from about 90 to about 98 wt. %, relative to the total weight of the coating. The epoxy silane may also comprise from about 50 to about 95 wt. %, relative to the total weight of the coating.

The multifunctional (meth)acrylate can be selected from any of the following groups (a)-(e):

(a) di(meth)acryl containing compounds such as 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, tripropylene glycol diacrylate;

(b) tri(meth)acryl containing compounds such as glycerol triacrylate, trimethylolpropane triacrylate, ethoxylated triacrylates (e.g., ethoxylated trimethylolpropane triacrylate), propoxylated triacrylates (e.g., propoxylated glyceryl triacrylate, propoxylated trimethylolpropane triacrylate), trimethylolpropane triacrylate, tris(2-hydroxyethyl)isocyanurate triacrylate;

(c) higher functionality (meth)acryl containing compounds such as ditrimethylolpropane tetraacrylate, dipentaerythritol pentaacrylate, pentaerythritol triacrylate, ethoxylated pentaerythritol tetraacrylate, and caprolactone modified dipentaerythritol hexaacrylate;

(d) oligomeric (meth)acryl compounds such as urethane acrylates, polyester acrylates and epoxy acrylates; and (e) nanoparticles that have been surface-modified with (meth)acrylate groups such as silica surface-modified with $CH_2=CMeC(O)O(CH_2)_3Si(OMe)_3$.

The multifunctional (meth)acrylate may be used in any amount desired depending on the desired properties of the coating. For example, the epoxy silane may comprise from about 1 to about 90 wt. % relative to the total weight of the coating.

The polymerizable fluorochemical may comprise an epoxy group, a hydrolysable silane group, or an epoxy group and a hydrolysable silane group. The polymerizable fluorochemical may comprise a (meth)acrylate group, also referred herein to a fluorinated (meth)acrylate. The polymerizable fluorochemical may comprise a mixture of: a first polymerizable fluorochemical comprising a hydrolysable silane group, and a second polymerizable fluorochemical comprising a (meth)acrylate group. The polymerizable fluorochemical may comprise a mixture of: a first polymerizable fluorochemical comprising an epoxy group and hydrolysable silane group, and a second polymerizable fluorochemical comprising a (meth)acrylate group. The polymerizable fluorochemical may comprise any of those disclosed in WO 2008/39683 (Padiyath et al.) and WO 2009/76389 (Hao et al.), both incorporated herein by reference.

The polymerizable fluorochemical may comprise a fluorinated (meth)acrylate represented by the formula:

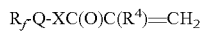

$R_f\text{-Q-XC(O)C}(R^4)=CH_2$ wherein: $R_f$ comprises a monovalent fluorinated group; Q comprises a divalent linking group; X comprises O, S, NH or $NR^5$ wherein $R^5$ is a $C_1$-$C_4$ alkyl group; and $R^4$ comprises H or $CH_3$.

The perfluoropolyether group $R_f$ can be linear, branched, cyclic, or combinations thereof and can be saturated or unsaturated. The perfluoropolyether group $R_f$ has at least two catenated oxygen atoms. Exemplary perfluoropolyethers include those having perfluorinated repeating units selected from the group consisting of $—(C_qF_{2q})—$, $—(C_qF_{2q}O)—$, $—(CF(W))—$, $—(CF(W)O)—$, $—(CF(W)C_qF_{2q}O)—$, $—(C_qF_{2q}CF(W)O)—$, $—(CF_2CF(W)O)—$, or combinations thereof. In these repeating units, q is typically an integer of 1 to 10. In some embodiments, q is an integer of 1 to 8, 1 to 6, 1 to 4, or 1 to 3. The group W is a perfluoroalkyl group, perfluoroether group, perfluoropolyether, or a perfluoroalkoxy group, all of which can be linear, branched, or cyclic. The W group typically has no more than 12 carbon atoms, no more than 10 carbon atoms, no more than 9 carbon atoms, no more than 4 carbon atoms, no more than 3 carbon atoms, no more than 2 carbon atoms, or no more than 1 carbon atom. In some embodiments, the W group can have no more than 4, no more than 3, no more than 2, no more than 1, or no oxygen atoms. In these perfluoropolyether groups, the different repeat units can be distributed randomly along the chain.

For monovalent $R_f$ groups, terminal groups can be $(C_qF_{2q+1})—$, $(C_qF_{2q+1}O)—$, $—(VC_qF_{2q}O)—$, or $—(VC_qF_{2q+1})—$ wherein q is as described in the previous paragraph and V is hydrogen, chlorine, or bromine. Exemplary monovalent $R_f$ groups include $CF_3O(C_2F_4O)_rCF_2—$ and $C_3F_7O(CF(CF_3)CF_2O)_rCF(CF_3)—$ wherein r has an average value of 0 to 50, 1 to 50, 3 to 30, 3 to 15, or 3 to 10.

Divalent $R_f$ groups include $—CF_2O(CF_2O)_r(C_2F_4O)_sCF_2—$, $—(CF_2)_3O(C_4F_8O)_s(CF_2)_3—$, $—CF_2O(C_2F_4O)_sCF_2—$, and $—CF(CF_3)(OCF_2CF(CF_3))_tOC_vF_{2v}O(CF(CF_3)CF_2O)_sCF(CF_3)—$ wherein r is as described in the previous paragraph; s has an average value of 0 to 50, 3 to 30, 3 to 15, or 3 to 10; t has an average value of 0 to 50, 1 to 50, 3 to 30, 3 to 15, or 3 to 10; the sum (n+t) has an average value of 0 to 50 or 4 to 40; the sum (r+s) is greater than 0; and v is an integer of 2 to 6.

As synthesized, compounds typically include a mixture of $R_f$ groups. The average structure is the structure averaged over the mixture components. The values of r, s, and t in these average structures can vary, as long as the group has a number average molecular weight of at least about 300 or at least about 1000. Useful $R_f$ groups often have a molecular weight (number average) of 300 to 5000, 800 to 4000, or 1000 to 5000.

Q may comprise any of the divalent linking groups described above for $L_1$. Q may comprise a covalent bond, e.g., the fluorinated (meth)acrylate may comprise $R_f—XC(O)C(R^4)=CH_2$ such as $R_f—OC(O)C(R^4)=CH_2$.

Examples of suitable fluorinated (meth)acrylates include perfluoropolyether (meth)acrylates such as: $C_3F_7O(CF(CF_3)CF_2O)_aCF(CF_3)CH_2OC(O)CH=CH_2$, $C_3F_7O(CF(CF_3)CF_2O)_aCF(CF_3)CH_2OC(O)C(CH_{0.3})=CH_2$, $C_3F_7O(CF(CF_3)CF_2O)_aCF(CF_3)CH_2OCH_2CH_2C(O)CH=CH_2$, $C_3F_7O(CF(CF_3)CF_2O)_aCF(CF_3)CH_2OCH_2CH_2OC(O)C(CH_{0.3})=CH_2$, $C_3F_7O(CF(CF_3)CF_2O)_aCF(CF_3)C(O)NHCH_2CH_2OC(O)CH=CH_2$, and $C_3F_7O(CF(CF_3)CF_2O)_aCF(CF_3)C(O)NHCH_2CH_2OC(O)C(CH_{0.3})=CH_2$, wherein a may be from 1 to 50.

The fluorinated (meth)acrylate may be represented by the formula:

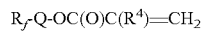

$R_f\text{-Q-OC(O)C}(R^4)=CH_2$ wherein: $R_f$ comprises $C_3F_7O(C_3F_6O)_rCF(CF_3)—$ with r being from 1 to 30, Q comprises a divalent linking group, and $R^4$ comprises H or $CH_3$.

The fluorinated (meth)acrylate may be used in any amount desired depending on the desired properties of the oligomer and/or the coating. For example, the fluorinated (meth)acrylate may comprise from about 5 to about 60 wt. %, from about 5 to about 50 wt. %, or from about 10 to about 40 wt. %, relative to the total weight of the oligomer.

The polymerizable fluorochemical may comprise a polymerizable fluorinated urethane having at least one urethane group, preferably at least two urethane groups, that is derived or derivable from the reaction of at least one polyfunctional isocyanate compound and at least one isocyanate-reactive perfluoropolyether compound. The polymerizable fluorinated urethane compound is terminated, on average, with (i) one or more perfluoroalkyl groups, one or more perfluoroheteroalkyl groups; and (ii) one or more silyl groups. It will be understood that the reaction product will provide a mixture of compounds, some percentage of which will comprise compounds as described, but may further comprise urethane compounds having different substitution patterns and degree of substitution.

Useful silane-functionalized perfluoropolyurethanes are disclosed, for example, in US 2009/0025727 (Klun et al.); US 2005/0054804 (Dams et al.); US 2005/0121644 (Dams et al.); US 2004/0147188 (Johnson et al.); and U.S. Pat. No. 7,097, 910 (Moore et al.). Such silane-functionalized perfluoropolyether urethanes are of the formula:

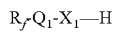  (1)

wherein $R_{f1}$ is a fluorine-containing group, such as a perfluoropolyether group as described above, and that includes a perfluorooxyalkyl group or a perfluorooxyalkylene group with the formula:

$$R_f\text{-}Q_1\text{-}X_1\text{—}H$$

wherein $R_f$ is a perfluoropolyether group as described above, $Q_1$ is a divalent linking group, $X_1$ is an isocyanate reactive group selected from O, S, and $NR_9$, wherein $R_9$ is H, aryl, or a $C_1$-$C_4$ alkyl group; $R_{si}$ is a silane-containing moiety of the formula:

$$\text{—NH—C(O)—}X_1\text{-}Q_2\text{-(Si(Y)}_p(R_{10})_{3-p})_q$$

wherein $Q_2$ is a linking group of valency q+1 and at least 2; $X_1$ is described above; Y is a hydrolysable group; and $R_{10}$ is a monovalent alkyl or aryl group; p is 1, 2 or 3; and q is from 1 to 6; x and y are each independently at least 1; and z is at least 1.

$Q_1$ and $Q_2$ can each independently comprise a straight, branched or cyclic group. $Q_1$ and $Q_2$ can include covalent bonds, an alkylene, an arylene, an aralkylene, or an alkarylene. $Q_1$ and $Q_2$ can include heteroatoms such as O, N, and S, and combinations thereof. $Q_1$ and $Q_2$ can include a heteroatom-containing functional group such as carbonyl or sulfonyl group or combinations thereof.

One useful example of perfluoropolyether urethane of Formula 1 has Formula (1A):

  (1A)

wherein $R_f$ is a residue of a multi-isocyanate; $X_1$, $Q_1$, and $Q_2$ are as defined above; $R_{f2}$ is a monovalent perfluoropolyether moiety that includes groups of the formula:

$$F(R_{fc}O)_wC_dF_{2d}\text{—}$$

wherein each $R_{fc}$ independently represents a fluorinated alkylene group having from 1 to 6 carbon atoms; each w is independently an integer of at least 2; d is an integer from 1 to 6; $Y_1$ is a hydrolysable group selected from —$OR_{11}$ and —OC(O)$R_{11}$, wherein $R_{11}$ is a lower alkyl of 1 to 4 carbon atoms; $R_{10}$ is a monovalent alkyl or aryl group; m is at least 1; n is at least 1; p is 1, 2 or 3; q is from 1 to 6; m+n is from 2 to 10; and each unit referred to by the subscripts m and n is attached to an $R_i$ unit.

Synthesis of silane-functionalized perfluoropolyether urethanes of Formula 1 often produces mixtures. In Formula (1A), for example, if the mole fraction of isocyanate groups is arbitrarily given a value of 1.0, then the total mole fraction of m and n units used in making the additive of Formula (1A) is at least 1.0. The mole fractions of m:n are from 0.95:0.05 to 0.05:0.95, from 0.50:0.50 to 0.05:0.95, from 0.25:0.75 to 0.05:0.95 or even from 0.25:0.75 to 0.10:0.95. In the instances the mole fractions of m:n total more than one, such as 0.15:0.90, the m unit is reacted onto the isocyanate first, and a slight excess (for example, 0.05 mole fraction) of the n units are used.

In a formulation, for instance, in which 0.15 mole fractions of m and 0.85 mole fraction of n units are introduced, a distribution of products is formed in which some fraction of products formed contain no m units. There will, however, be present in this product distribution, the additives of Formulas (1) and (1A).

A variety of compounds that include hydrolysable silane groups that are isocyanate reactive, or that may add free-radically or in Michael fashion to unsaturated double bonds, include, for example, $H_2N(CH_2)_3Si(OCH_3)_3$, $H(CH_3)N(CH_2)_3Si(OCH_3)_3$, $HS(CH_2)_3Si(OCH_3)_3$, and $HN((CH_2)_3Si(OCH_3)_3)_2$.

Exemplary silane-functionalized perfluoropolyether urethanes include those represented by Formulas 1A-1 to 1A-4:

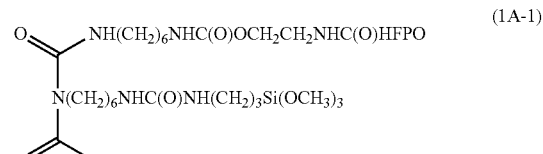  (1A-1)

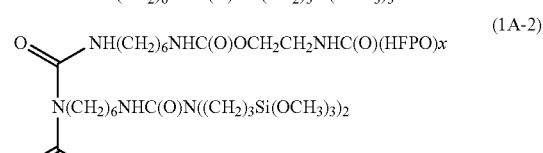  (1A-2)

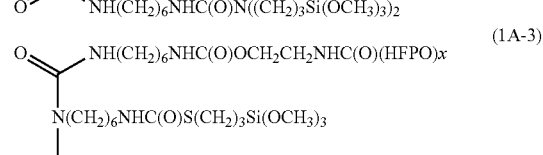  (1A-3)

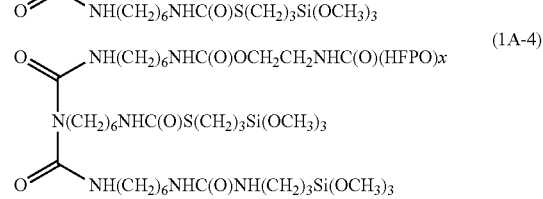  (1A-4)

In some embodiments, $R_{si}$ of Formula (1) may comprise:

$$\text{—NHC(O)}X_1Q_3CH_2CH_2SQ_4SiQ_4\text{-(Si(Y)}_p(R_{10})_{3-p})_q \quad (1B)$$

wherein $X_1$, Y, $R_{10}$, p and q are defined above; $Q^3$ is a polyvalent group that includes alkylene, arylene or a combination thereof (for example, an alkarylene group), the alkylene group optionally including at least one catenary oxygen atom; and $Q_4$ is a divalent alkylene group optionally including at least one catenary oxygen atom.

In some embodiments, the silane-functionalized perfluoropolyether urethane may comprise:

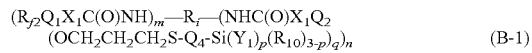  (B-1)

wherein $R_{f2}$, $Q_1$, $Q_2$, $Q_4$, $X_1$, $Y_1$, $R_{10}$, m, n, p and q are defined above.

An exemplary silane-functionalized perfluoropolyether urethanes is represented by Formula 1B-1:

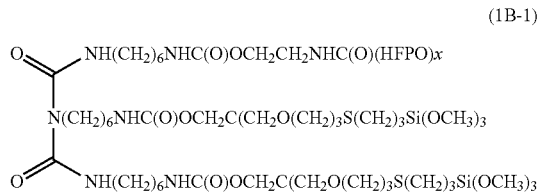
(1B-1)

In some embodiments, $R_{si}$ of Formula (1) may comprise:

(1C)

wherein $R_{12}$ is $R_3Si(Y)_p(R_{10})_{3-p}$ or $R_{10}$, $X_2$ is —O— or —S—, and all other groups are defined as above.

In some embodiments, the silane-functionalized perfluoropolyether urethane may comprise:

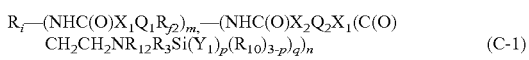
(C-1)

wherein all groups are defined above.

An exemplary silane-functionalized perfluoropolyether urethanes is represented by Formula 1C-1:

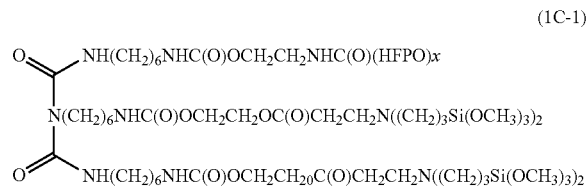
(1C-1)

Polyfunctional isocyanate compounds useful in the present invention comprise isocyanate groups attached to the multi-valent organic group, Q, which can comprise a multivalent aliphatic, alicyclic, or aromatic moiety; or a multivalent aliphatic, alicyclic or aromatic moiety attached to a blocked isocyanate, a biuret, an isocyanurate, or a uretdione, or mixtures thereof. Preferred polyfunctional isocyanate compounds contain at least two and preferably three or more —NCO groups. Compounds containing two —NCO groups are comprised of divalent aliphatic, alicyclic, araliphatic, or aromatic moieties to which the —NCO radicals are attached. Preferred compounds containing three —NCO radicals are comprised of isocyanatoaliphatic, isocyanatoalicyclic, or isocyanatoaromatic, monovalent moieties, which are attached to a biuret or an isocyanurate.

Preferred polyisocyanates, in general, include those selected from the group consisting of hexamethylene 1,6-diisocyanate (HDI), 1,12-dodecane diisocyanate isophorone diisocyanate, toluene diisocyanate, dicyclohexylmethane 4,4'-diisocyanate, MDI, derivatives of all the aforementioned, including Desmodur™ N-100, N-3200, N-3300, N-3400, N-3600, and mixtures thereof.

In some embodiments, the silane-functionalized perfluoropolyether urethane may comprise a compound as described in U.S. Pat. No. 6,646,088 (Fan et al.) which can be represented by the following formulas:

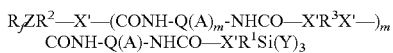

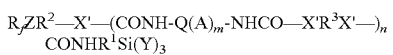

wherein:
$R_fZR^2$— is a residue of at least one of the fluorochemical monofunctional compounds;
$R_f$ is a perfluoropolyether group;
Z is a covalent bond, sulfonamido (—SO$_2$NR—), or carboxamido (—CONR—) where R is hydrogen or alkyl;
$R^1$ is an alkylene, heteroalkylene, aralkylene, or heteroaralkylene group;
$R^2$ is a divalent straight or branched chain alkylene, cycloalkylene, or heteroalkylene group of 1 to 14 carbon atoms, preferably 1 to 8 carbon atoms, more preferably 1 to 4 carbon atoms, and most preferably two carbon atoms, and preferably $R^2$ is alkylene or heteroalkylene of 1 to 14 carbon atoms;
Q is a multi-valent organic group that is a residue of the polyfunctional isocyanate compound;
$R^3$ is a polyvalent, preferably divalent organic group which is a residue of the hydrophilic polyoxyalkylene;
X' is —O—, —S—, or —N(R)—, wherein R is hydrogen or $C_1$-$C_4$ alkyl;
each Y is independently a hydroxy; a hydrolysable moiety selected from the group consisting of alkoxy, acyloxy, heteroalkoxy, heteroacyloxy, halo, and oxime; or a non-hydrolysable moiety selected from the group consisting of phenyl, alicyclic, straight-chain aliphatic, and branched-chain aliphatic, wherein at least one Y is a hydrolysable moiety;
A is selected from the group consisting of $R_fZR^2$—OCONH—, $(Y)_3SiR^1XCONH$—, and $(Y)_3SiR^1NHCOOR^3OCONH$—;
m is an integer from 0 to 2; and
n is an integer from 1 to 10.

It will be understood with respect to the above formulas that the compounds represent theoretical structures for the reaction products. The reaction product will contain a mixture of compounds in which the substitution patterns of the isocyanate groups will vary.

Polyols suitable include those organic polyols that have an average hydroxyl functionality of at least about 2 (preferably, about 2 to 5; more preferably, about 2 to 3; most preferably, about 2, as diols are most preferred). The hydroxyl groups can be primary or secondary, with primary hydroxyl groups being preferred for their greater reactivity. Mixtures of diols with polyols that have an average hydroxyl functionality of about 2.5 to 5 (preferably about 3 to 4; more preferably, about 3) can also be used. It is preferred that such mixtures contain no more than about 20 percent by weight of such polyols, more preferably no more than about 10 percent, and most preferably no more than about 5 percent. Preferred mixtures are mixtures of diols and triols.

Suitable polyols include those that comprise at least one aliphatic, heteroaliphatic, alicyclic, heteroalicyclic, aromatic, heteroaromatic, or polymeric moiety. Preferred polyols are aliphatic or polymeric polyols that contain hydroxyl groups as terminal groups or as groups that are pendant from the backbone chain of the polyol.

Preferred polyols include 2,2-bis(hydroxymethyl)propionic acid; N,N-bis(2-hydroxyethyl)-3-aminopropyltriethoxysilane; bicine; 3,5-dihydroxybenzoic acid; 2,4-dihydroxybenzoic acid; N-bis(2-hydroxyethyl)perfluorobutyl sulfonamide; 1,2-ethanediol; 1,2- and 1,3-propanediol; 1,3- and 1,4-butanediol; neopentylglycol; 1,5-pentanediol; 3-methyl-1,5-pentanediol; 1,2-, 1,5-, and 1,6-hexanediol; bis(hydroxymethyl)cyclohexane; 1,8-octanediol; 1,10-decanediol; di(ethylene glycol); tri(ethylene glycol); tetra(ethylene glycol); di(propylene glycol); di(isopropylene glycol); tri(propylene glycol); poly(ethylene glycol)diols (number average molecular weight of about 200 to about 1500); poly(di(ethylene glycol) phthalate)diol (having number average molecular weights of, for example, about 350 or about 575); poly(propylene glycols)diols (number average molecular weight of about 200 to about 500); block copolymers of poly(ethylene glycol) and poly(propylene glycol) such as PLURONIC™ L31 (available from BASF Corporation, Mount Olive, N.J.); polydimethylsiloxane diol; fluorinated oxetane polyols made by the ring-opening polymerization of fluorinated oxetane such as POLY-3-FOX™ (available from Omnova Solutions, Inc., Akron, Ohio); polyetheralcohols prepared by ring opening addition polymerization of a fluorinated organic group substituted epoxide with a compound containing at least two hydroxyl groups as described in U.S. Pat. No. 4,508,916 (Newell et al); perfluoropolyether diols such as FOMBLIN™ ZDOL $(HOCH_2CF_2O(CF_2O)_{8-12} (CF_2CF_2O)_{8-12}CF_2CH_2OH$, available from Ausimont, Inc., Thorofare, N.J.); 1,4-bis(1-hydroxy-1,1-dihydroperfluoroethoxyethoxy)perfluoro-n-butane $(HOCH_2CF_2OC_2F_4O(CF_2)_4 OC_2F_4OCF_2CH_2OH)$; 1,4-bis(1-hydroxy-1,1-dihydroperfluoropropoxy)perfluoro-n-butane $(HOCH_2CF_2CF_2O (CF_2)_4 OCF_2CF_2CH_2OH)$; polycaprolactone diols (number average molecular weight of about 200 to about 600); resorcinol; hydroquinone; 1,6-, 2,5-, 2,6-, and 2,7-dihydroxynaphthalene; 4,4'-biphenyl; bisphenol A; bis(4-hydroxyphenyl)methane; and the like; and mixtures thereof. More preferred polyols include bis(hydroxymethyl)propionic acid; bicine; N-bis(2-hydroxyethyl)perfluorobutylsulfonamide; 1,2-ethanediol; 1,2- and 1,3-propanediol; 1,4-butanediol; neopentylglycol; 1,2- and 1,6-hexanediol; di(ethylene glycol); tri(ethylene glycol); 1,4-bis(1-hydroxy-1,1-dihydroperfluoropropoxy)perfluoro-n-butane $(HOCH_2CF_2CF_2O(CF_2)_4 OCF_2CF_2CH_2OH)$; fluorinated oxetane polyols made by the ring-opening polymerization of fluorinated oxetane such as POLY-3-FOX™ (available from Omnova Solutions, Inc., Akron Ohio); poly(di(ethylene glycol)phthalate)diol (having number average molecular weights of, for example, about 350 or about 575); poly(ethylene glycol)diols (having number average molecular weights of, for example, about 200, 300, 400); polydimethylsiloxane diol; polypropylene glycol (having a number average molecular weight of, for example, about 425); dimer diol; polycaprolactone diol (having a number average molecular weight of, for example, about 530); 3,5-dihydroxybenzene; bisphenol A; resorcinol; hydroquinone; and mixtures thereof.

The oligomer may comprise: the polymerizable fluorochemical comprising from about 5 to about 60 wt. %, the epoxy silane comprises from about 5 to about 90 wt. %, and the multifunctional (meth)acrylate comprises from about 5 to about 90 wt. %, all relative to the total weight of the oligomer. The epoxy(meth)acrylate may be represented by the formula:

$$G\text{-}L_1\text{-}OC(O)C(R_4)\!\!=\!\!CH_2$$

wherein: G, $L_1$ and $R_4$ are as described above. For example, the epoxy(meth)acrylate may comprise glycidyl(meth)acrylate. Other particular epoxy(meth)acrylates are described in International Application No. PCT/US2009/036733 to Qiu et al.

The epoxy(meth)acrylate may be used in any amount desired depending on the desired properties of the oligomer and/or the coating. For example, the epoxy (meth)acrylate may comprise from about 5 to about 90 wt. %, or from about 10 to about 60 wt. %, relative to the total weight of the oligomer.

The silane (meth)acrylate may be represented by the formula:

$$(R_2O)_{3-a}(R_1)_a Si\text{-}L_1\text{-}OC(O)C(R_4)\!\!=\!\!CH_2$$

wherein $L_1$, $R_1$, $R_2$ and $R_4$ are as described above. Exemplary silane (meth)acrylates include acryloxypropyl trialkoxysilanes and methacryloxypropyl trialkoxysilanes. For example, the silane (meth)acrylate may comprise gamma-methacryloxypropyl trimethoxysilane. Ethylenically unsaturated silanes such as vinyl trialkoxy silanes may also be used.

The silane (meth)acrylate may be used in any amount desired depending on the desired properties of the oligomer and/or the coating. For example, the silane (meth)acrylate may comprise from about 5 to about 90 wt. %, or from about 10 to about 60 wt. %, relative to the total weight of the oligomer.

The coating may further comprise a multifunctional epoxide. Useful multifunctional epoxides include those having cycloaliphatic functionality. The multifunctional epoxide may be selected from the group consisting of: bis-(3,4-epoxycyclohexylmethyl)adipate; 1,4-cyclohexanedimethanol diglycidyl ether; and glycerol propoxylate triglycidyl ether. The multifunctional epoxide may comprise bis-(3,4-epoxycyclohexylmethyl)adipate and 1,4-cyclohexanedimethanol diglycidyl ether. Other multifunctional epoxides are described in Application No. PCT/US2009/036733 to Qiu et al.

The multifunctional epoxide may be used in any amount desired depending on the desired properties of the coating. For example, the multifunctional epoxide may comprise from about 0.05 to about 30 wt. % or from about 0.05 to about 20 wt. %, relative to the total weight of the coating. The multifunctional epoxide may also comprise from about 0.02 to about 15 wt. %, or from about 0.05 to about 10 wt. %, relative to the total weight of the coating.

The coating may further comprise a curable silane represented by the formula:

$$Si(R^6)_d(R)_{4-c}$$

wherein: $R^6$ comprises an alkyl, aryl, arylalkylenyl or alkylarylenyl group; $R^7$ comprises a halide, hydroxyl, aryloxy, acyloxy or polyalkyleneoxy group; and d is 0, 1 or 2.

The coating may further comprise the multifunctional epoxide and the curable silane.

The coating may further comprise tetraorthosilicate.

The oligomer is generally prepared by free radical polymerization of these monomers in the presence of one or more chain transfer agents. Suitable chain transfer agents include, for example, hydroxy-, amino-, mercapto, silane and halogen substituted organic compounds such as tetrabromomethane and mercapto substituted derivatives of ethane, propane, butane, octane, dodecane, propanol, butanol, propanediol, ethylamine and the like. The chain transfer agent is typically present in an amount sufficient to control the number of polymerized monomer units and molecular weight of the oligomer, for example, in an amount of from about 0.005 equivalents to about 0.5 equivalents, per equivalent of monomer.

Additional (meth)acrylates without silane and epoxy functional groups may be used to prepare the oligomer. Additional (meth)acrylates may contain functional groups which are not reactive to silane and epoxy group. Representative (meth)acrylates are methyl acrylate, methyl methacrylate, ethyl acrylate, 2-bromoethyl acrylate, n-butyl acrylate, t-butyl acrylate, hexyl acrylate, n-octyl acrylate, n-octyl methacrylate, iso-octyl acrylate, octadecyl acrylate, methoxy polyethylene glycol monomethacrylate, tetrahydrofurfuryl acrylate, alkoxylated tetrahydrofurfuryl acrylate, lauryl acrylate, alkoxylated lauryl acrylate, 2-phenoxyethyl acrylate, menthyl acrylate, n-benxylacrylate, tridecyl acrylate, caprolactone acrylate, isobornyl acrylate, alkoxylated phenol acrylate, polypropylene glycol monoacrylate, acrylonitrile, 2-cyanoethyl acrylate, 1H,1H,2H,2H-perfluorobutyl acrylate, 1H,1H,2H,2H-perfluorohexyl acrylate, and methyl vinyl ketone.

The oligomer may be prepared using a polymerization initiator such as a VAZO product available from DuPont Co. Other suitable polymerization initiators include azo compounds such as azobisisobutyronitrile (AIBN), hydroperoxides, peroxides and the like.

Polymerization to form the oligomer may be carried out in any solvent suitable for organic free-radical reactions. The monomers can be present in the solvent at any suitable concentration including, for example, from about 5% by weight to about 90% by weight based on the total weight of the reaction mixture. Suitable solvents include, for example, aliphatic, alicyclic and aromatic hydrocarbons, ethers, esters, ketones, sulfoxides and the like. Solvents may be selected based on considerations such as the solubility of reagents, the temperature required for the use of a particular initiator, and desired molecular weight. Suitable temperatures for polymerization are from about 30 to about 200° C.

The coating may be prepared using a photoacid generator or cationic photoinitiator in conjunction with UV radiation. Useful cationic photoiniators include many types of aryl-substituted compounds in the form of salts, for example, aromatic onium salts such as salts of Groups Va, VIIa and VIIa elements. Cationic photoinitiators are available as CYRACURE products from Ciba Geigy Co., for example, CYRACURE UVI-6974. Other cationic photoinitiators are described in International Application No. PCT/US2009/036733 to Qiu et al. Cationic initiator is typically present in the compositions of the invention in a range from about 1% to about 5% by weight.

Preferably, the coating is formed from a solvent-free coating composition. In some embodiments, however, the compositions comprise solvent such as, for example, ketones (for example, acetone, methyl ethyl ketone (MEK) or methyl isobutyl ketone (MIBK)), esters (for example, ethyl acetate, methyl isobutyl ether, or propylene carbonate), or ethers (for example, methyl tert-butyl ether (MTBE) or tetrahydrofuran (THF)), or combinations.

The coating may comprise curable silanes, titanates and zirconates. For example, silicates such as tetraalkyl orthosilicates may be used in an amount of up to about 40 wt. % relative to the total weight of the coating. Other curable additives include tetramethoxysilane, tetraethoxysilane, methyltriethoxysilane, dimethyldiethoxysilane, octadecyltriethoxysilane, methyltrichlorosilane, tetramethyl orthotitanate, tetraethyl orthotitanate, tetraisopropyl orthotitanate, tetraethylzirconate, tetraisopropylzirconate, and tetrapropylzirconate.

The coating may be used on any type of suitable substrate, for example, a substrate comprising natural stone, man-made stone, ceramic, vinyl, wood, masonry, cork, glass, plastic or the like. In some embodiments, the substrate may comprise an optically clear substrate which may have low haze (for example, less than about 5% or even less than about 2%) and high transparency (for example, greater than 95% or greater than 98%) for visible and ultraviolet light. Optically clear substrates may comprise glass, fused silica, polyethylene terephthalate (PET), polycarbonate, or poly(methyl)methacrylate.

The coating may be present on a substrate in an amount that does not substantially change the appearance, such as optical characteristics, of the underlying substrate. The thickness of the coating may be from about 0.5 to about 40 microns, from about 2 to about 15 microns or from about 2 to about 10 microns. In some cases, for example when the coating is a single layer sole coating, the thickness may be from about 1 to about 100 microns. If the coating comprises multiple layers disposed on top of one another, the topmost layer can be much thinner than the layer underneath. For example, the topmost layer may be from about 20 Angstroms to about 1 micron or from about 40 to about 100 nm. A useful total thickness for the coating (which includes all layers in a multiple layer coating) can be any suitable thickness including, e.g., from about 0.5 to about 40 micron, or from about 1 to about 5 micron. If multiple layers are used, then they may have the same or different compositions.

The coating compositions can be applied to a substrate using any suitable method or technique including, e.g., spraying, brushing, wiping, knife coating, notch coating, reverse roll coating, gravure coating, soaking, dip coating, bar coating, flood coating, spin coating and combinations thereof, and in any suitable form including a continuous or discontinuous layer. The resulting coating can likewise be in a variety of forms including, e.g., a continuous or discontinuous layer (e.g., in a pattern, dots, stripes and swirls).

After or during coating, the coating composition is cured or at least partially cured using radiation such as UV radiation. If solvent is present, it may be at least partially removed (e.g., using a forced air oven, through evaporation at elevated and ambient temperatures, and combinations thereof), and the composition is then at least partially cured to form the coating.

The coatings disclosed herein may be used in making phototools. Useful phototools include those wherein the coating is disposed on an optically clear substrate. The optically clear substrate comprises an image such as a circuit pattern formed using a digital imaging system. An assembly is formed by disposing a photosensitive material or photoresist on a metal substrate, wherein the coating layer and the photosensitive material are adjacent each other. The photosensitive material may comprise a photographic emulsion layer comprising silver halide or azo emulsion. Chrome metal absorbing film may also be used. The metal substrate may comprise copper sheeting. The assembly is then exposed to radiation such that the photosensitive material is cured (developed and fixed) to form hardened portions that form an image of the phototool. At some point, the phototool and the photosensitive material after curing are separated. The negative image of the hardened photosensitive material is washed, dried, examined and optionally retouched.

Thus, a method of making a printed assembly such as a printed circuit board, is disclosed. The method comprises: providing the assembly described in the previous paragraph, and exposing the photoresist layer to radiation through the phototool, thereby hardening the photoresist layer in selected areas to form a negative image of the image provided by the optically clear substrate. The method may further comprise separating the phototool from the hardened photoresist layer.

EXAMPLES

Objects and advantages of this invention are further illustrated by the following examples, but the particular materials and amounts thereof recited in these examples, as well as other conditions and details, should not be construed to unduly limit this invention.

Materials

Materials utilized in the examples are shown in Table 1.

TABLE 1

| Material | Supplier |
| --- | --- |
| Water | Millipore Corporation, Billerica, MA |
| Acetone | EMD Chemicals Inc., Gibbstown, NJ |
| Toluene | EMD Chemicals Inc., Gibbstown, NJ |
| IPA, Isopropylalchohol | VWR International, West Chest, PA |
| EtOAc, Ethyl acetate | J. T. Baker, Phillipsburg, NC |
| MEK, Methyl ethyl ketone | EMD Chemicals Inc., Gibbstown, NJ |
| DMF, N,N-dimethylformamide | Sigma-Aldrich, St. Louis, MO |
| THF, Tetrahydrofuran | EM Science, Gibbstown, NJ |
| A-186, β-(3,4-epoxycyclohexyl)-ethyltrimethoxysilane) | GE Advanced Materials, Albany, NY |
| A-187, γ-Glycidoxypropyltrimethoxysilane | GE Advanced Materials, Albany, NY |
| A-174, $CH_2$=$CMeC(O)O(CH_2)_3Si(OMe)_3$ | GE Advanced Materials, Albany, NY |
| A-189, $HS(CH_2)_3Si(OMe)_3$ | GE Advanced Materials, Albany, NY |
| HFPO—MAr, $F(CF(CF_3)CF_2O)_xCF(CF_3)$—$C(O)NHCH_2CH_2OCO$—$CMe$=$CH_2$ | 3M Company, St. Paul, MN See U.S. Pat. No. 7,094,829 |
| HFPO—OH, $F(CF(CF_3)CF_2O)_xCF(CF_3)$—$C(O)NHCH_2CH_2OH$ | 3M Company, St. Paul, MN |
| GMA, Glycidyl methacrylate | Sigma-Aldrich, St. Louis, MO |
| N100, Polyisocyanates Desmodur ® | Bayer Polymers LLC, Pittsburgh, PA |
| APTMS, Aminopropyltrimethoxy silane, $H_2N(CH_2)_3Si(OCH_3)_3$ | Sigma-Aldrich, St. Louis, MO |
| SR444, Pentaerythritol triacrylate | Sartomer Company, Exton, PA |
| SR399, dipentaerythritol pentaacrylate | Sartomer Company, Exton, PA |
| SR351, Trimethylolpropane triacrylate | Sartomer Company, Exton, PA |
| PI-1, photo-initiator, Cyracure TM UVI-6976, triarylsulphonium hexafluoroantimonate, 50% in propylene carbonate | Dow Chemical Company, Midland, MI |
| PI-2, photo-initiator, Darocur TM 1173 (2-hydroxy-2-methyl-1-phenyl-propan-1-one) | Ciba Specialty Chemicals, White Plains, NY |
| Vazo ® 67, 2,2'-Azobis(2-methylbutyronitrile) | DuPont, Wilmington, DE |
| TEOS, Tetraethyl orthosilicate | Sigma-Aldrich, St. Louis, MO |
| ERL-4299, Bis-(3,4-epoxycyclohexylmethyl) adipate | Dow Chemical Company, Midland, MI |
| GPTE, Glycerol propoxylate triglycidyl ether | Sigma-Aldrich, St. Louis, MO |
| $CBr_4$, Tetrabromomethane | Sigma-Aldrich, St. Louis, MO |
| DBTDL, Dibutyltin dilaurate catalyst | Sigma-Aldrich, St. Louis, MO |
| 906 Coating, nano-silica modified with A-174 | 3M Company, St. Paul, MN |
| FX-1000, Scotchgard Film Protector | 3M Company, St. Paul, MN |

Test Methods

Contact Angle Measurement

The coated films were rinsed for 1 minute with hand agitation in an IPA bath prior to the water and hexadecane contact angles measurements. Measurements were made using a VCA-2500XE video contact angle analyser available from AST Products (Billerica, Mass.). Reported values are the average of at least 2 drops, while each drop was measured twice. Drop volumes were 5 μL for static measurements and 1-3 μL for advancing and receding.

Marker Repellent Test

A Sharpie® King Size Permanent Marker, Sharpie® Permanent Marker and Vis-à-vis® Permanent Overhead Project Pen (all from Sanford, Oak Brook, Ill.) were used to mark on the cured coating. The ink was visually assessed and scored from 5 (ink complete bead-up) to 1 (no bead-up).

Steel Wool Durability Test

The abrasion resistance of the cured films was tested crossweb to the coating direction by use of a mechanical device capable of oscillating steel wool fastened to a stylus across the film's surface. The stylus oscillated over a 10 cm wide sweep at a rate of 3.5 wipes/second. A wipe is defined as a single travel of 10 cm. The stylus had a flat, cylindrical geometry with a diameter of 3.8 mm having a 400 g load. The steel wool was obtained from Rhodes-American a division of Homax Products, Bellingham, Wash. under the trade designation "#0000-Super-Fine" and was used as received. Each composition was tested once, with each test consisting of 50 wipes with the 400 g load. After each test, the Marker Repellent Test, utilizing the Sharpie® marker, and the water and hexadecane contact angle were measured on the abraded surface.

Solvent Resistant Test

One drop (approximately 1.25 cm diameter) of an organic solvent was placed on the cured coatings. The solvent was allowed to evaporate to dryness at room temperature and the coating was visually rated. A "clear" rating indicates a clear surface without observable damage to the coating, while "hazy" indicates a hazy surface. In addition, the Marker Repellent Test was used with the Sharpie® marker to test the dried solvent spot.

Tissue Wipe Test

Sight Savers pre-moisture lens cleaning tissue made from Bausch&Lomb, which contain IPA, were used to wipe the cured surface 20 times. After wiping and drying the surface, the Marker Repellent Test was used with the Sharpie® marker to test the wiped area, and the wiped surface was visually inspected and rated as clear or hazy.

Coating Quality

Coating quality was visually assessed and rated as Excellent, Good, OK, or Some Dewetting.

Preparation of Polymerizable Fluorochemicals

FA-1, Fluorinated Polyacrylate Silane, HFPO-MAr/A174/A189

To a 4 Oz bottle 4.0 g of HFPO-MAr, 6.0 g A-174, 0.20 g A-189, 30 g EtOAc, and 0.20 g Vazo-67 were added. Nitrogen was bubbled into this mixture for 1 minute, followed by heating to 70° C. The bottle was sealed and reacted at 70° C.

for 4 hours with magnetic stirring. A clear, homogeneous solution was obtained. FTIR analysis indicated no $CH_2=CMe-$ remained.

FA-2, Fluorinated Polyacrylate Epoxy-Silane, HFPO-MAr/GMA/A174

To a 4 oz. bottle, 4.0 g of HFPO-MAr, 1.0 g GMA, 5.0 g A-174, 0.068 g $CBr_4$, 30 g EtOAc, and 0.19 g Vazo-67 were added. Nitrogen was bubbled into this mixture for 1 minute, followed by heating to 70° C. The bottle was sealed and reacted at 70° C. for 4 hours with magnetic stirring. A clear, homogeneous solution was obtained. FTIR analysis indicated no unreacted $CH_2=CMe-$.

FA-3, Fluorinated Polyacrylate Epoxide, HFPO-MAr/GMA

To a 4 oz. bottle, 3.0 g of HFPO-MAr, 7.0 g GMA, 0.027 g $CBr_4$, 30 g EtOAc, and 0.28 g Vazo-67 were added. Nitrogen was bubbled into this mixture for 1 minute, followed by heating to 70° C. The bottle was sealed and reacted at 70° C. for 4 hours with magnetic stirring. A clear, homogeneous solution was obtained. FTIR analysis indicated no unreacted $CH_2=CMe-$.

FA-4, Fluorinated Polyurethane Acrylate, HFPO—OH/N100/SR444

To a 500 ml round bottom 2-necked flask equipped with a thermometer and condenser, 25 g, N100, 26 g HFPO—OH, and 110 g MEK were added under dry nitrogen. Two drops DBTDL were added with magnetic stirring. This mixture was reacted at 70° C. for approximately 2 hours to give a homogeneous solution, then cooled to room temperature. Once cooled, 58 g SR444 was added and the mixture was reacted at 60° C. for approximately 5 hours. FTIR analysis indicated no unreacted isocyanate. The mixture was diluted with EtOAc to a final concentration of 30%.

FA-5, Fluorinated Polyurethane Silane, HFPO—OH/N100/APTMS

To a 100 ml round bottom flask, 6.3 g N100, 18 g THF, and 0.00079 g DBTDL were added under nitrogen. The mixture was heated to 55° C. under nitrogen with magnetic stirring for 5 minutes to form a homogenous solution. To this solution was added 4.3 g HFPO—OH dropwise over about 10 min. This solution was reacted at 55° C. under nitrogen with magnetic stirring for 2 hours, at which time 5.3 g APTMS was added dropwise over about 15 min. Two hours after the addition was complete, FTIR analysis indicated no unreacted isocyanate groups. The mixture was diluted with THF to a concentration of 50%, then diluted with IPA to a final concentration of 30%.

FA-6, Fluorinated acrylate, $C_4F_9SO_2N(CH_3)C_2H_4O-C(O)N(H)C_6H_4-CH_2C_6H_4N(H)CO-OC_2H_4OCOCH=CH_2$ (MeFBSE-MDI-HEA)

FA-6 was prepared according to the procedure described in US Patent Publication No. 2005/0143541, paragraph 0104.

Preparation of (Meth)Acrylate Formulations

Representative (meth)acrylate (A) formulations were prepared by mixing the components in the following weight ratios.

A-1: SR399/PI-2, 99/1; 30% solution in MEK
A-2: SR351/PI-2, 99/1; 30% solution in EtOAc
A3: 906 coating; 30% solution in 1:1 EtOAc/IPA
A-4: SR444/FA-4/PI-2, 99.5/0.5/1; 30% solution in EtOAc
A-5: SR399/FA-4/PI-2, 98.5/0.5/1; 30% solution in 1:1 EtOAc/IPA
A-6: SR444/PI-2, 99/1; 30% solution in MEK
A-7: 906 coating/FA-4, 99/1; 30% solution in 1:1 EtOAc/IPA Preparation of Epoxy Silane Formulations Representative epoxy silane (ES) formulations were prepared by mixing the components in the following weight ratios.

ES-1: A-187/PI-1, 92/8; 30% solution in EtOAc
ES-2: A-186/PI-1, 92/8; 30% solution in EtOAc
ES-3: A-187/FA-2/PI-1, 89/2/9; 30% solution in EtOAc
ES-4: A-187/FA-1/PI-1, 89/2/9; 30% solution in EtOAc
ES-5: A-187/FA-4/PI-1, 94.4/0.6/5; 20% solution in EtOAc
ES-6: FX-1000/FA-2, 96/4; 30% solution in EtOAc Preparation of Epoxy Acrylate Formulations A representative epoxy acrylate (EA) coating formulations was prepared by mixing the components in the following weight ratios.

EA-1: GMA/PI-2, 98/2; 30% solution in EtOAc

Preparation of Coating Formulations

Each coating formulation was prepared by combining and mixing the individual components. All formulations were coated on primed polyester (Melinex 618, DuPont, Wilmington, Del.) with a No#6 wire rod, dried for 2 minutes at 120° C., and cured with one of the UV sources listed below. The formulations were generally clear, indicating good compatibility of the fluorinated additives with the coating formulations.

UV-H: H-Bulb under $N_2$, two pass at 20 feet per minute
UV-G: Two Sylvania Germicidal G15T8 (15 W) bulbs for 2 minutes Representative examples of blended epoxy-silane and acrylate formulations and performance are summarized in following tables. All formulations are based on weight %.

Different polymerizable fluorochemicals, including perfluoropolyether polyacrylates and perfluoropolyether polyurethanes bearing curable silane groups, epoxide groups, acrylate groups or their combinations, as well as short C4F9-based acrylate groups (FA-6) have been studied as additives in epoxy-silane (ES-1)/acrylate (A-1) systems and cured with different UV sources. The coating properties are shown in Table 2. The addition of the polymerizable fluorochemicals showed not only improved coating quality, but also significantly improved water and oil repellency compared to a coating containing no polymerizable fluorochemical (C-1).

TABLE 2

| Form. Number | UV Cure | Formulation Composition | Water Adv/Rec/Static | | | Hexadecane Adv/Rec/Static | | | Coating Quality |
|---|---|---|---|---|---|---|---|---|---|
| C-1 | G | ES-1/A-1 80/20 (No FA) | 65 | 40 | 63 | [a] | [a] | [a] | Some dewetting |
| E-1 | H | ES-1/A-1 80/20 + 2% FA-1 | 119 | 94 | 112 | 72 | 63 | 71 | Good |
| E-2 | H | ES-1/A-1 80/20 + 1% FA-2 | 117 | 87 | 110 | 69 | 60 | 67 | Good |
| E-3 | G | ES-1/A-1 80/20 + 1% FA-3 | 119 | 75 | 111 | 70 | 63 | 72 | Good |
| E-4 | H | ES-1/A-1 80/20 + 1% FA-3 | 117 | 73 | 109 | 73 | 53 | 71 | Good |

TABLE 2-continued

| Form. Number | UV Cure | Formulation Composition | Water Adv/Rec/Static | | | Hexadecane Adv/Rec/Static | | | Coating Quality |
|---|---|---|---|---|---|---|---|---|---|
| E-5 | H | ES-1/A-1 80/20 + 1% FA-4 | 118 | 81 | 108 | 70 | 63 | 71 | Good |
| E-6 | G | ES-1/A-1 80/20 + 1% FA-5 | 111 | 73 | 100 | 70 | 63 | 71 | OK |
| E-7 | H | ES-1/A-1 80/20 + 1% FA-5 | 118 | 75 | 108 | 70 | 65 | 71 | Good |
| E-8 | G | ES-1/A-1 80/20 + 10% FA-6 | 112 | 93 | 111 | 80 | 74 | 79 | Good |
| E-9 | H | ES-1/A-1 80/20 + 10% FA-6 | 119 | 99 | 114 | 78 | 69 | 75 | Good |

[a] angles were too low to measure

Similar results were observed with an epoxy-silane (ES-1)/acrylate (A-2) system. Significantly improved water and oil repellency over the comparative (C-2) were observed as shown in Table 3.

TABLE 3

| Form. Number | UV Cure | Formulation Composition | Water Adv/Rec/Static | | | Hexadecane Adv/Rec/Static | | | Coating Quality |
|---|---|---|---|---|---|---|---|---|---|
| C-2 | G | ES-1/A-2 80/20 (No FA) | 84 | 41 | 80 | [a] | [a] | [a] | Some dewetting |
| E-10 | G | ES-1/A-2 80/20 + 1% FA-3 | 87 | 49 | 82 | 65 | 32 | 64 | OK |
| E-11 | G | ES-1/A-2 80/20 + 1% FA-5 | 108 | 69 | 96 | 79 | 69 | 77 | OK |
| E-12 | H | ES-1/A-2 80/20 + 1% FA-5 | 121 | 71 | 110 | 74 | 60 | 73 | Good |
| E-13 | G | ES-1/A-2 80/20 + 10% FA-6 | 117 | 94 | 113 | 77 | 70 | 76 | OK |
| E-14 | H | ES-1/A-2 80/20 + 10% FA-6 | 112 | 103 | 113 | 79 | 72 | 77 | Good |

[a] angles were too low to measure

The addition of polymerizable fluorochemicals in the A-186 epoxy-silane (ES-2)/acrylate (A-1) system also showed significantly improved water and oil repellency. Results are shown in Table 4.

TABLE 4

| Formulation Number | Formulation Composition [a] | Water Adv/Rec/Static | | | Hexadecane Adv/Rec/Static | | | Coating Quality |
|---|---|---|---|---|---|---|---|---|---|
| C-3 | ES-2/A-1 80/20 (No FA) | 82 | 64 | 74 | 13 | 5 | 9 | Good |
| E-15 | ES-2/A-1 80/20 + 2% FA-1 | 117 | 97 | 109 | 70 | 61 | 69 | Good |
| E-16 | ES-2/A-1 80/20 + 2% FA-2 | 118 | 96 | 109 | 71 | 61 | 71 | Good |
| E-17 | ES-2/A-1 80/20 + 2% FA-3 | 115 | 84 | 104 | 72 | 47 | 55 | Good |
| E-18 | ES-2/A-1 80/20 + 2% FA-4 | 111 | 55 | 100 | 71 | 34 | 63 | Good |
| E-19 | ES-2/A-1 80/20 + 2% FA-5 | 120 | 73 | 109 | 74 | 61 | 73 | Good |

[a] All formulations cured with UV-H

The nano-silica based acrylate coating (A-3) combined with an epoxy-silane (ES-1) also showed a similar reduction in surface energy with the addition of polymerizable fluorochemicals as shown in Table 5.

TABLE 5

| Form Number | UV Cure | Formulation Composition | Water Adv/Rec/Static | | | Hexadecane Adv/Rec/Static | | | Coating Quality |
|---|---|---|---|---|---|---|---|---|---|
| C-4 | G | ES-1/A-3 80/20 (No FA) | 82 | 49 | 70 | 13 | 5 | 11 | OK |
| C-5 | H | ES-1/A-3 80/20 (No FA) | 71 | 44 | 68 | [a] | [a] | [a] | OK |
| E-20 | G | ES-1/A-3 80/20 + 1% FA-3 | 108 | 52 | 99 | 70 | 57 | 69 | Good |
| E-21 | H | ES-1/A-3 80/20 + 1% FA-3 | 111 | 60 | 97 | 71 | 39 | 69 | Good |
| E-22 | G | ES-1/A-3 80/20 + 1% FA-5 | 114 | 73 | 101 | 71 | 65 | 72 | Good |
| E-23 | H | ES-1/A-3 80/20 + 1% FA-5 | 121 | 67 | 111 | 77 | 51 | 75 | Good |
| E-24 | G | ES-1/A-3 80/20 + 10% FA-6 | 118 | 86 | 11 | 79 | 73 | 78 | OK |
| E-25 | H | ES-1/A-3 80/20 + 10% FA-6 | 120 | 104 | 117 | 77 | 69 | 75 | Good |

[a] angles were too low to measure

Tables 6 though 10 list the coating properties from additional formulations containing epoxy-silane blended with an acrylate component containing at least one polymerizable fluorochemical.

TABLE 6

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-26 | ES-3/A-4 100/0 | 5/5/5 | 119 | 98 | 112 | 71 | 64 | 69 | Excellent |
| E-27 | ES-3/A-4 80/20 | 5/5/5 | 119 | 97 | 113 | 71 | 65 | 70 | Excellent |
| E-28 | ES-3/A-4 60/40 | 5/5/5 | 119 | 95 | 112 | 71 | 65 | 69 | Excellent |
| E-29 | ES-3/A-4 40/60 | 5/5/5 | 119 | 95 | 112 | 71 | 66 | 69 | Excellent |
| E-30 | ES-3/A-4 20/80 | 5/5/5 | 118 | 85 | 110 | 70 | 62 | 68 | Excellent |
| E-31 | ES-3/A-4 0/100 | 4/5/4 | 102 | 71 | 98 | 58 | 47 | 58 | Excellent |

[a] All formulations cured with UV-H
[b] Order tested: King/Permanent/Vis-à-vis ®

After the coating and initial testing of the ES-3/A-4 series, the coated films of Table 6 were abraded with steel wool according to the Steel Wool Durability Test. Contact angles and marker repellency were measured on the abraded surface with results shown in Table 7. Contact angles were very similar after abrasion, and marker repellency was maintained.

TABLE 7

| Formulation Number | Visible Scratches | Marker Repellent [a] | Water Adv/Rec/Static | | | Hexadecane Adv/Rec/Static | | |
|---|---|---|---|---|---|---|---|---|
| E-26 | No | 5/5/5 | 118 | 94 | 111 | 72 | 63 | 69 |
| E-27 | No | 5/5/5 | 116 | 91 | 111 | 72 | 61 | 68 |
| E-28 | No | 5/5/5 | 116 | 97 | 111 | 69 | 43 | 68 |
| E-29 | No | 5/5/5 | 118 | 92 | 111 | 70 | 60 | 68 |
| E-30 | No | 5/5/5 | 115 | 86 | 111 | 68 | 55 | 65 |
| E-31 | No | 4/5/4 | 99 | 60 | 96 | 48 | 22 | 47 |

[a] Order tested: King/Permanent/Vis-à-vis ®

TABLE 8

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-32 | ES-4/A-4 100/0 | 5/5/5 | 120 | 102 | 113 | 73 | 65 | 70 | Excellent |
| E-33 | ES-4/A-4 80/20 | 5/5/5 | 119 | 99 | 111 | 72 | 64 | 69 | Good |

TABLE 8-continued

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-34 | ES-4/A-4 60/40 | 5/5/5 | 120 | 96 | 114 | 72 | 65 | 70 | Good |
| E-35 | ES-4/A-4 40/60 | 5/5/5 | 119 | 94 | 111 | 73 | 64 | 69 | Good |
| E-36 | ES-4/A-4 0/100 | 4/5/5 | 114 | 67 | 111 | 66 | 47 | 65 | Excellent |

[a] All formulations cured with UV-H
[b] Order tested: King/Permanent/Vis-à-vis ®

After coating and initial testing of the ES-4/A-4 series, the coated films of Table 8 were abraded with steel wool according to the Steel Wool Durability Test. Contact angles and marker repellency were measured on the abraded surface with results shown in Table 9. Contact angles were very similar after abrasion, and marker repellency was maintained.

TABLE 9

| Form. Number | Visible Scratches | Marker Repellent [a] | Water Adv/Rec/Static | | | Hexadecane Adv/Rec/Static | | |
|---|---|---|---|---|---|---|---|---|
| E-32 | No | 5/5/5 | 119 | 92 | 114 | 74 | 57 | 70 |
| E-33 | No | 5/5/5 | 118 | 94 | 114 | 70 | 60 | 68 |
| E-34 | No | 5/5/5 | 117 | 92 | 112 | 71 | 61 | 69 |
| E-35 | No | 5/5/5 | 117 | 89 | 113 | 73 | 61 | 70 |
| E-36 | No | 4/5/5 | 111 | 70 | 106 | 63 | 44 | 63 |

[a] Order tested: King/Permanent/Vis-à-vis ®

TABLE 10

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-37 | ES-4/A-5 80/20 | 3/4/5 | 117 | 84 | 111 | 72 | 66 | 70 | Good |
| E-38 | ES-4/A-5 60/40 | 5/5/5 | 124 | 81 | 118 | 74 | 57 | 71 | Excellent |
| E-39 | ES-4/A-5 40/60 | 5/4/2 | 124 | 57 | 118 | 73 | 34 | 71 | Excellent |
| E-40 | ES-4/A-5 20/80 | 5/5/5 | 115 | 66 | 110 | 68 | 48 | 67 | Excellent |
| E-41 | ES-4/A-5 0/100 | 4/5/5 | 116 | 86 | 102 | 67 | 59 | 66 | Excellent |

[a] All formulations cured with UV-H
[b] Order tested: King/Permanent/Vis-à-vis ®

Additional formulations and test results are shown in Tables 11 through 13.

TABLE 11

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-42 | ES-5/EA 95/5 | 4/5/5 | 120 | 74 | 112 | 73 | 65 | 71 | Excellent |
| E-43 | ES-5/EA 90/10 | 3/5/5 | 120 | 74 | 109 | 75 | 69 | 72 | Excellent |
| E-44 | ES-5/EA 80/20 | 2/3/3 | 119 | 56 | 110 | 74 | 65 | 71 | Excellent |
| E-45 | ES-5/EA 60/40 | 2/4/5 | 118 | 66 | 111 | 73 | 69 | 71 | Excellent |
| E-46 | ES-5/EA 40/60 | 2/4/5 | 116 | 61 | 110 | 74 | 69 | 71 | Excellent |

TABLE 11-continued

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-47 | ES-5/EA/A-6 9/1/2 | 5/5/5 | 116 | 78 | 110 | 73 | 68 | 71 | Excellent |
| E-48 | ES-5/EA/A-6 9/1/4 | 4/5/5 | 114 | 73 | 108 | 74 | 68 | 71 | Excellent |
| E-49 | ES-5/EA/A-6 9/1/6 | 4/5/5 | 116 | 77 | 110 | 73 | 69 | 71 | Excellent |

[a] All formulations cured with UV-G
[b] Order tested: King/Permanent/Vis-à-vis ®

TABLE 12

| Form. Number | Formulation Composition [a] | Marker Repellent [b] | Water Adv/Rec/Static | | | Hexadecane Adv/Rec/Static | | | Coating Quality |
|---|---|---|---|---|---|---|---|---|---|
| E-50 | ES-6/A-7 100/0 | 4/5/5 | 115 | 85 | 108 | 71 | 56 | 70 | Excellent |
| E-51 | ES-6/A-7 76/24 | 5/5/5 | 113 | 65 | 107 | 68 | 56 | 66 | Excellent |
| E-52 | ES-6/A-7 20/80 | 3/4/5 | 124 | 81 | 113 | 78 | 46 | 75 | Excellent |
| E-53 | ES-6/A-7 8/92 | 5/5/5 | 121 | 101 | 112 | 74 | 66 | 71 | Excellent |
| E-54 | ES-6/A-7 0/100 | 5/5/5 | 116 | 96 | 111 | 72 | 64 | 70 | Excellent |
| C-6 | FX 1000 (no FA) | 4/3/3 | 100 | 61 | 101 | 33 | 30 | 35 | Good |

[a] All formulations cured with UV-H
[b] Order tested: King/Permanent/Vis-à-vis

After the coating and initial testing of the ES-6/A-7 series, the coated films of Table 12 were abraded with steel wool according to the Steel Wool Durability Test. Contact angles were measured on the abraded surface with results shown in Table 13.

TABLE 13

| Formulation Number | Visible Scratches | Water Adv/Rec/Static | | | Hexadecane Adv/Rec/Static | | |
|---|---|---|---|---|---|---|---|
| E-50 | No | 108 | 80 | 107 | 68 | 54 | 66 |
| E-51 | Few | 104 | 46 | 99 | 61 | 42 | 59 |
| E-52 | Few | 112 | 70 | 110 | 71 | 40 | 112 |
| E-53 | No | 120 | 94 | 112 | 73 | 65 | 70 |
| E-54 | No | 117 | 88 | 111 | 74 | 62 | 70 |

As a protective coating, it is important for the coating to be resistant to solvents that may be present in cleaning solutions. As a release liner, it is important that the liner be resistant to solvents that may be present in adhesives. Several experimental formulations (E-1, E-2, E-5, E-8, E-9, E-14, E-15, E-16, E-22, E-25, E-27, E-89, E-29, E-33, E-34, E-38, E-47, E-53, E-54) were tested for their compatibility with the following solvents: EtOAc, IPA, Acetone, Toluene, MEK, DMF. For all solvents tested, the film was rated as "clear" after solvent evaporation, and the Sharpie® permanent marker repellency was rated a 5.

Various modifications and alterations to this invention will become apparent to those skilled in the art without departing from the scope and spirit of this invention. It should be understood that this invention is not intended to be unduly limited by the illustrative embodiments and examples set forth herein and that such examples and embodiments are presented by way of example only with the scope of the invention intended to be limited only by the claims set forth herein as follows.

What is claimed is:

1. An oligomer comprising the reaction product of an epoxy silane, a multifunctional (meth)acrylate, and a polymerizable fluorochemical; wherein the multifunctional (meth)acrylate is selected from the groups (a)-(e):
   (a) di(meth)acryl containing compounds selected from 1,3-butylene glycol diacrylate, 1,4-butanediol diacrylate, 1,6-hexanediol diacrylate, 1,6-hexanediol monoacrylate monomethacrylate, ethylene glycol diacrylate, alkoxylated aliphatic diacrylate, alkoxylated cyclohexane dimethanol diacrylate, alkoxylated hexanediol diacrylate, alkoxylated neopentyl glycol diacrylate, caprolactone modified neopentylglycol hydroxypivalate diacrylate, caprolactone modified neopentylglycol hydroxypivalate diacrylate, cyclohexanedimethanol diacrylate, diethylene glycol diacrylate, dipropylene glycol diacrylate, ethoxylated bisphenol A diacrylate, hydroxypivalaldehyde modified trimethylolpropane diacrylate, neopentyl glycol diacrylate, polyethylene glycol diacrylate, propoxylated neopentyl glycol diacrylate, tetraethylene glycol diacrylate, tricyclodecanedimethanol diacrylate, triethylene glycol diacrylate, and tripropylene glycol diacrylate;
   (b) tri(meth)acryl containing compounds selected from glycerol triacrylate, trimethylolpropane triacrylate, ethoxylated triacrylates, propoxylated triacrylates, trimethylolpropane triacrylate, and tris(2-hydroxyethyl)isocyanurate triacrylate;
   (c) higher functionality (meth)acryl containing compounds selected from ditrimethylolpropane tetraacrylate, dipentaerythritol pentaacrylate, pentaerythritol triacrylate, ethoxylated pentaerythritol tetraacrylate, and caprolactone modified dipentaerythritol hexaacrylate;

(d) oligomeric (meth)acryl compounds selected from urethane acrylates, polyester acrylates and epoxy acrylates; and (e) nanoparticles that have been surface-modified with (meth)acrylate groups.

2. The oligomer of claim 1, wherein the polymerizable fluorochemical comprises an epoxy group.

3. The oligomer of claim 1, wherein the polymerizable fluorochemical comprises a hydrolysable silane group.

4. The oligomer of claim 1, wherein the polymerizable fluorochemical comprises a fluorinated (meth)acrylate.

5. The oligomer of claim 1, wherein the polymerizable fluorochemical comprises the reaction product of a fluorinated (meth)acrylate and an epoxy (meth)acrylate.

6. The oligomer of claim 1, wherein the polymerizable fluorochemical comprises the reaction product of a fluorinated (meth)acrylate and a silane (meth)acrylate.

7. The oligomer of claim 1, wherein the polymerizable fluorochemical comprises the reaction product of a fluorinated (meth)acrylate, an epoxy (meth)acrylate, and a silane (meth)acrylate.

8. The oligomer of claim 1, wherein the polymerizable fluorochemical comprises a polymerizable fluorinated urethane.

9. The oligomer of claim 8, wherein the polymerizable fluorinated urethane comprises hydrolysable silane groups.

10. The oligomer of claim 1, wherein the epoxy silane is gamma-glycidoxypropyl trimethoxysilane or beta-(3,4-epoxycyclohexyl)ethyl trimethoxysilane.

11. A composition comprising the reaction product of:
(a) an epoxy (meth)acrylate and/or a silane (meth)acrylate; and
(b) the oligomer of claim 1.

12. The composition of claim 11, further comprising a multifunctional epoxide.

13. The composition of claim 12, wherein the multifunctional epoxide is: bis-(3,4-epoxycyclohexylmethyl) adipate; 1,4-cyclohexanedimethanol diglycidyl ether; or glycerol propoxylate triglycidyl ether.

14. The composition of claim 11, wherein:
the epoxy silane comprises from about 5 to about 90 wt. %;
the multifunctional (meth)acrylate comprises from about 5 to about 90 wt. %; and
the polymerizable fluorochemical comprises from about 5 to about 60 wt. %;
all relative to the total weight of the oligomer.

15. The composition of claim 11, further comprising a curable silane represented by the formula:

$$Si(R^6)_d(R^7)_{4-c}$$

wherein:
$R^6$ comprises an alkyl, aryl, arylalkylenyl or alkylarylenyl group;
$R^7$ comprises a halide, hydroxyl, aryloxy, acyloxy or polyalkyleneoxy group;
and d is 0, 1 or 2.

16. The composition of claim 15, further comprising a multifunctional epoxide.

17. The composition of claim 11, further comprising tetraethyl orthosilicate.

18. The composition of claim 11, further comprising a radical photoinitiator and a photoacid generator.

19. An article comprising a coating disposed on a substrate, the coating having a thickness of from about 0.5 to about 40 um And comprising the composition of claim 11.

20. The article of claim 19, wherein the substrate comprises an optically clear substrate that provides an image and the article is a phototool.

21. An assembly comprising:
the phototool of claim 20;
a photoresist disposed on the coating; and
a metal substrate disposed on the photoresist opposite the coating.

22. The assembly of claim 21, wherein the photoresist comprises a photosensitive emulsion.

\* \* \* \* \*

UNITED STATES PATENT AND TRADEMARK OFFICE
CERTIFICATE OF CORRECTION

PATENT NO. : 8,748,060 B2  
APPLICATION NO. : 13/389043  
DATED : June 10, 2014  
INVENTOR(S) : Zai-Ming Qiu Page 1 of 1

It is certified that error appears in the above-identified patent and that said Letters Patent is hereby corrected as shown below:

Title Page, Column 2 References Cited (Other Publications)
Line 2, Delete "Joh" and insert -- John --, therefor.

In the Specification
Column 13
Line 26, Delete "Va, VIIa and VIIa" and insert -- Va, VIa and VIIa --, therefor.

Column 15
Line 26 (Table 1), Delete "Cyracure TM" and insert -- Cyracure™ --, therefor.

Column 15
Line 29 (Table 1), Delete "Darocur TM" and insert -- Darocur™ --, therefor.

Signed and Sealed this  
Ninth Day of December, 2014

Michelle K. Lee  
*Deputy Director of the United States Patent and Trademark Office*